(12) United States Patent
Lee et al.

(10) Patent No.: US 11,539,033 B2
(45) Date of Patent: Dec. 27, 2022

(54) DISPLAY DEVICE

(71) Applicant: Samsung Display Co., Ltd., Yongin-si (KR)

(72) Inventors: Seung Min Lee, Hwaseong-si (KR); Tae Hyun Kim, Seoul (KR); Dong Hwan Shim, Hwaseong-si (KR); Seon Beom Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 284 days.

(21) Appl. No.: 16/821,058

(22) Filed: Mar. 17, 2020

(65) Prior Publication Data

US 2020/0328382 A1    Oct. 15, 2020

(30) Foreign Application Priority Data

Apr. 11, 2019   (KR) .......................... 10-2019-0042502

(51) Int. Cl.
   *H01L 51/52*      (2006.01)
   *F21V 8/00*       (2006.01)
   *H01L 27/32*      (2006.01)

(52) U.S. Cl.
   CPC ........ *H01L 51/5275* (2013.01); *G02B 6/0051* (2013.01); *G02B 6/0053* (2013.01); *H01L 51/5253* (2013.01); *H01L 51/5268* (2013.01); *H01L 27/3244* (2013.01)

(58) Field of Classification Search
   CPC ............. H01L 51/5275; H01L 51/5253; H01L 51/5268; H01L 27/3244; G02B 6/0051; G02B 6/0053
   USPC .......................................................... 257/88
   See application file for complete search history.

(56) References Cited

U.S. PATENT DOCUMENTS

| | | | |
|---|---|---|---|
| 8,572,893 B2 | 11/2013 | Watanabe | |
| 10,012,861 B2 | 7/2018 | Wang et al. | |
| 10,222,537 B2 * | 3/2019 | Park | G02B 6/0043 |
| 2008/0101088 A1 | 5/2008 | Kim et al. | |
| 2016/0370644 A1 * | 12/2016 | Wang | G02F 1/133526 |
| 2017/0192291 A1 | 7/2017 | Shi | |
| 2017/0322361 A1 * | 11/2017 | Park | G02F 1/133603 |

* cited by examiner

*Primary Examiner* — Tu-Tu V Ho
(74) *Attorney, Agent, or Firm* — H.C. Park & Associates, PLC

(57) ABSTRACT

A display device includes a front display area, a first side display area, a second side display area, a corner display area, a display panel, and a light guide member. The first side display area extends from a first side of the front display area. The second side display area extends from a second side of the front display area. The corner display area is disposed between the first side display area and the second side display area. The display panel overlaps the front display area and does not overlap the corner display area. The light guide member is disposed in the corner display area.

17 Claims, 16 Drawing Sheets

DISPLAY DEVICE

CROSS-REFERENCE TO RELATED APPLICATION

This application claims priority to and the benefit of Korean Patent Application No. 10-2019-0042502, filed Apr. 11, 2019, which is hereby incorporated by reference for all purposes as if fully set forth herein.

BACKGROUND

Field

Exemplary embodiments generally relate to a display device.

Discussion

The importance of a display device has increased with the development of multimedia. Accordingly, various types of display devices, such as an organic light emitting display (OLED) device and a liquid crystal display (LCD) device have been used. Among them, the OLED device has attracted considerable intention as a next-generation display device at least because it is a self-luminous display device and has an excellent viewing angle. Further, the OLED device may be realized as a flexible display device that can at least be bent, flexed, folded, twisted, warped, and/or the like (hereinafter, referred to as flexed), the utilization of the OLED device in electronic appliances is gradually increasing.

The above information disclosed in this section is only for understanding the background of the inventive concepts, and, therefore, may contain information that does not form prior art.

SUMMARY

Some exemplary embodiments provide a display device capable of minimizing a dead space by displaying images in corner areas, as well as a front area and side areas.

Additional aspects will be set forth in the detailed description which follows, and, in part, will be apparent from the disclosure, or may be learned by practice of the inventive concepts.

According to some exemplary embodiments, a display device includes a front display area, a first side display area, a second side display area, a corner display area, a display panel, and a light guide member. The first side display area extends from a first side of the front display area. The second side display area extends from a second side of the front display area. The corner display area is disposed between the first side display area and the second side display area. The display panel overlaps the front display area and does not overlap the corner display area. The light guide member is disposed in the corner display area.

According to some exemplary embodiments, a display device includes a first display area, a second display area, a display panel, and a light guide member. The second display area is adjacent to the first display area. The display panel is disposed in the second display area and does not overlap the first display area. The light guide member is disposed in the first display area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
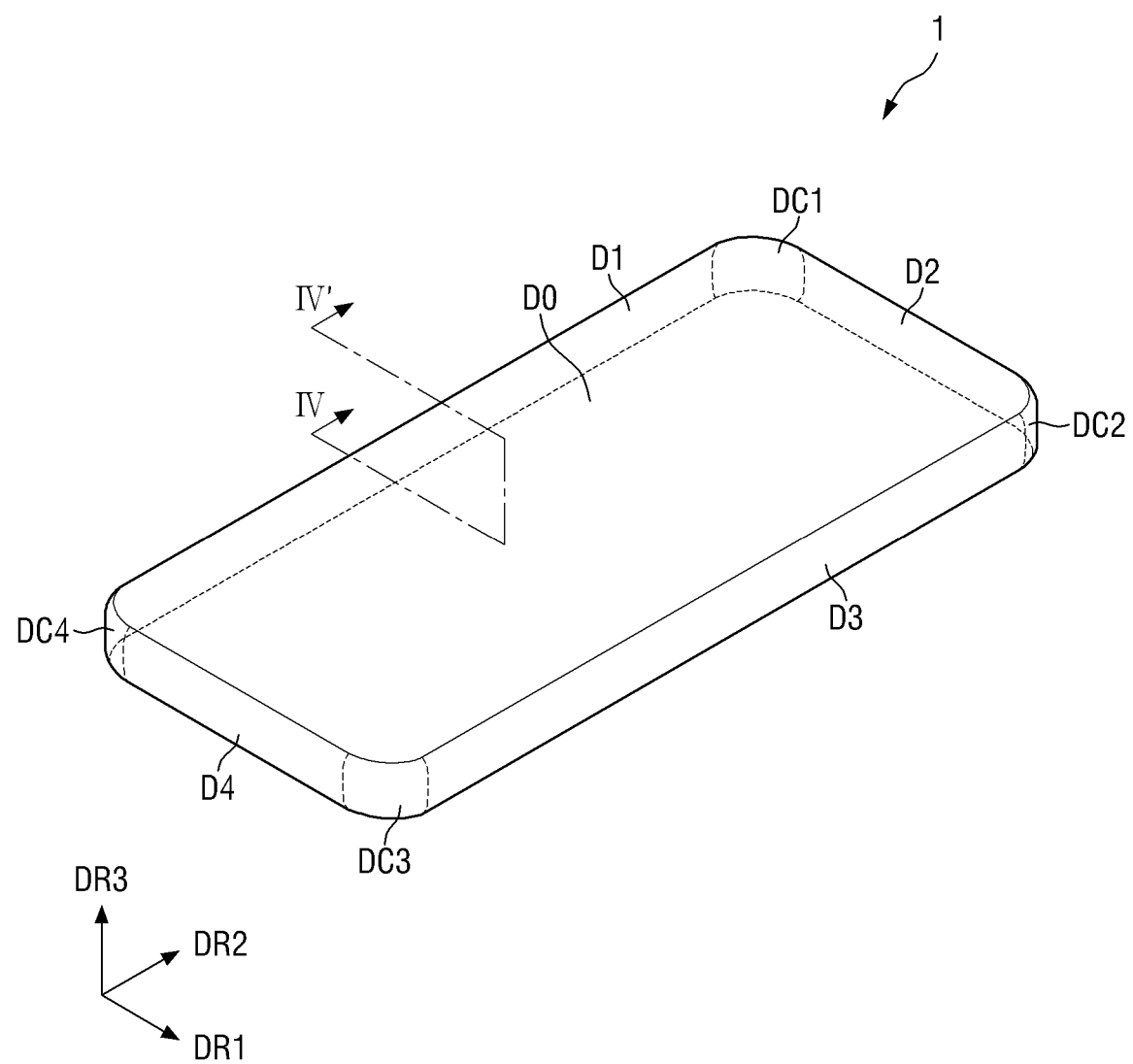
FIG. 1 is a perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

For the purposes of this disclosure, the first direction DR1 indicates an X-axis direction, the second direction DR2 indicates a Y-axis direction, and the third direction DR3 indicates a Z-axis direction.

Figure 2:
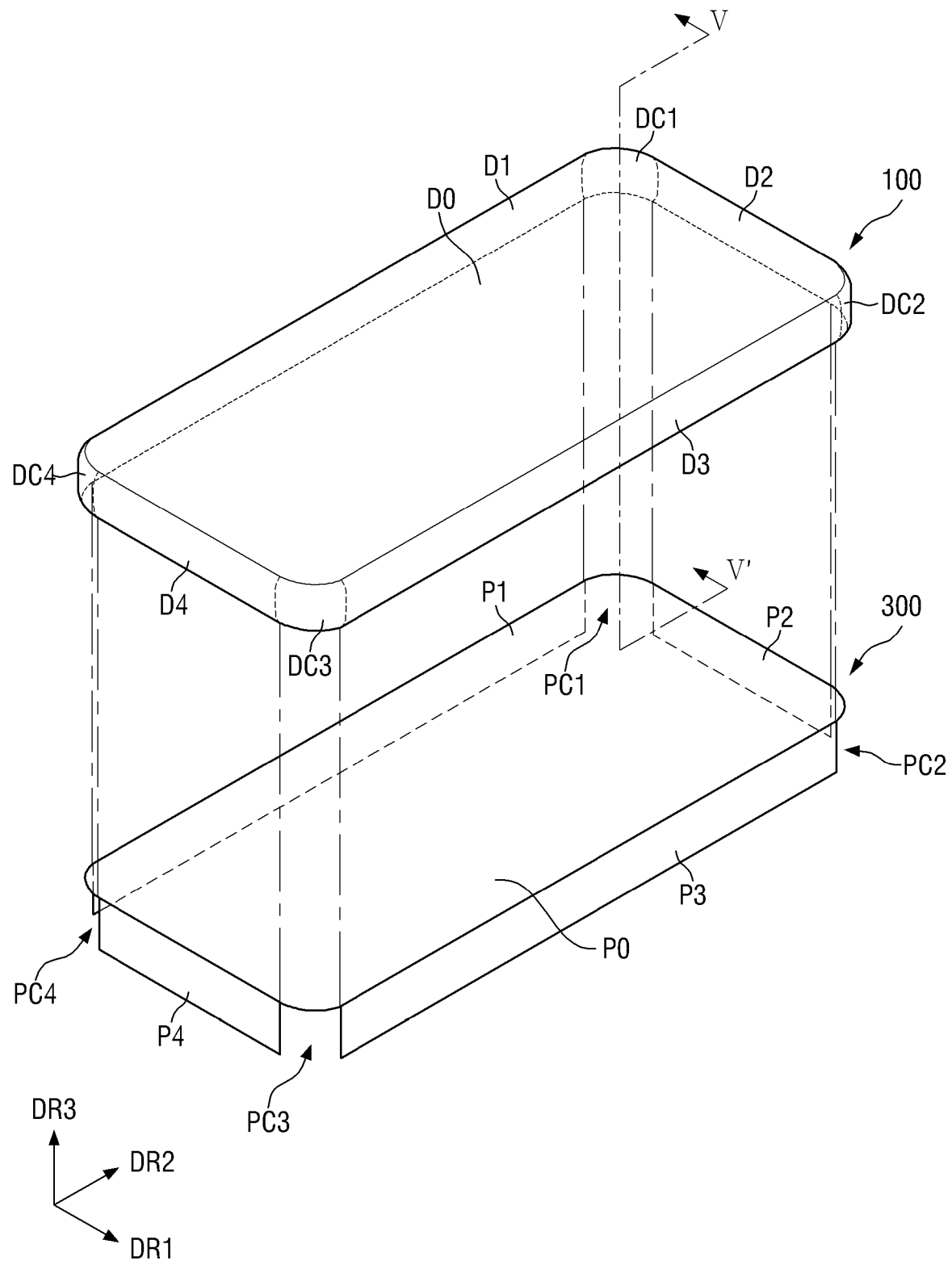
FIG. 2 is an exploded perspective view showing a relationship between a cover window and a display panel according to some exemplary embodiments.
Figure 3:
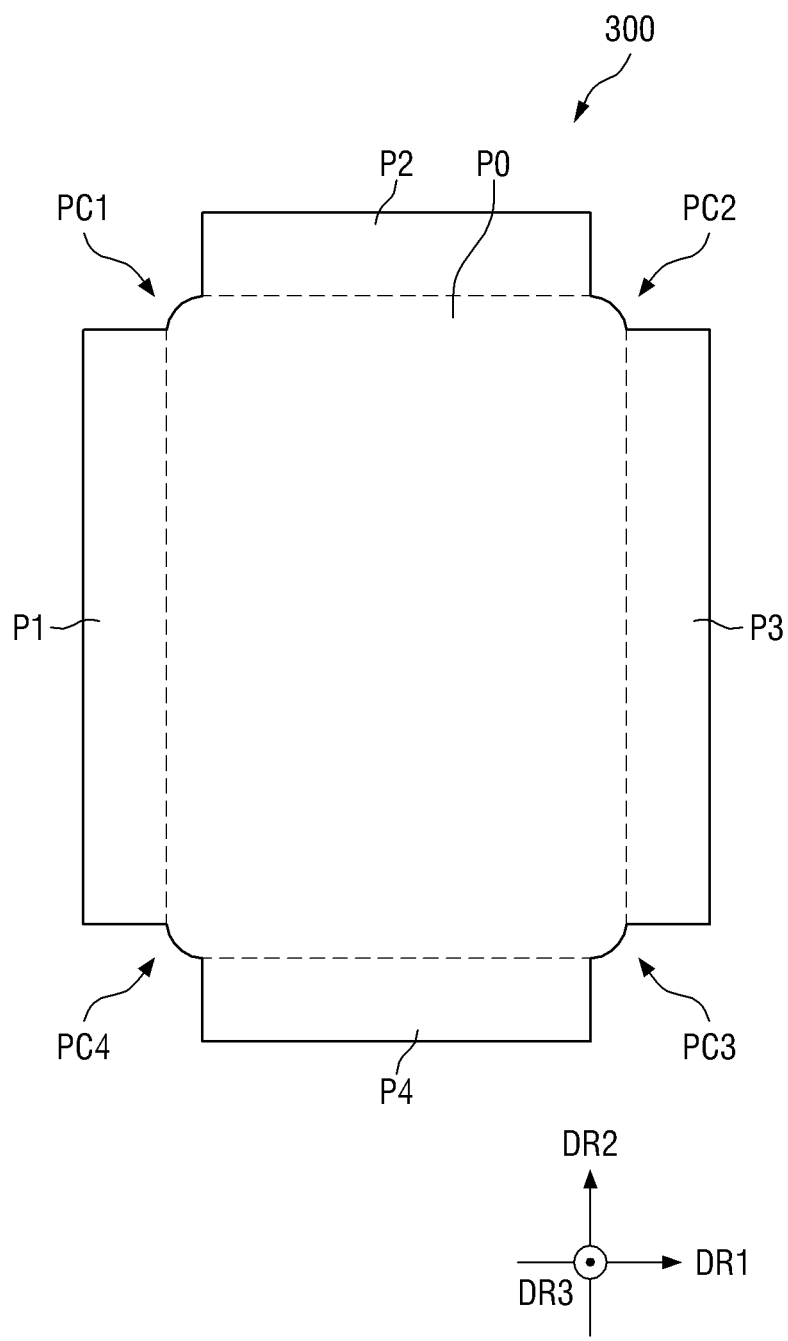
FIG. 3 is a developed view of a display panel according to some exemplary embodiments.

FIG. 1 is a perspective view of a display device according to some exemplary embodiments. FIG. 2 is an exploded perspective view showing a relationship of a cover window and a display panel according to some exemplary embodiments. FIG. 3 is a developed view of a display panel according to some exemplary embodiments.

Referring to FIGS. 1 to 3, a display device 1 according to some exemplary embodiments, which is a device for displaying a mobile (or moving) image or a still image, may be used in (or with) not only portable electronic appliances, such as mobile phones, smart phones, tablet personal computers (tablet PCs), smart watches, watch phones, etc., but may also be utilized in various display screen providing devices, such as televisions, notebooks, monitors, billboards, internet of things (IOTs) devices, etc.

Referring to FIGS. 1 to 3, the display device 1 may include a front display area D0, side display areas D1, D2, D3, and D4, and corner display areas DC1, DC2, DC3, and DC4, as display areas for displaying images.

The front display area D0 may have at least one rounded corner. The front display area D0 may have at least one rounded polygonal corner. As shown in FIG. 1, the front display area D0 may have a rectangular shape in which corners are rounded, but exemplary embodiments are not limited thereto.

The first to fourth side display areas D1, D2, D3, and D4 may extend outward from edges of the front display area D0 and may be bent at a predetermined angle. For example, the first to fourth side display areas D1, D2, D3, and D4 may be bent at an angle of 90° or more and 150° or less with respect to the front display area D0.

The first to fourth side display areas D1, D2, D3, and D4 may include the first side display area D1 extending to the other side of the front display area D0 in (or opposite to) the first direction DR1, the second side display area D2 extending to one side of the front display area D0 in the second direction DR2, the third side display area D3 extending to one side of the front display area D0 in the first direction DR1, and the fourth side display area D4 extending to the other side of the front display area D0 in (or opposite to) the second direction DR2. The first to fourth side display areas D1, D2, D3, and D4 may have substantially the same function or configuration as each other, except for their positions. Hereinafter, common characteristics of the first to fourth side display areas D1, D2, D3, and D4 will be described with reference to the first side display area D1, and a duplicate description will be omitted. Further, although it is exemplified that the first side display area D1 extending from the front display area D0 has a rectangular shape, exemplary embodiments are not limited thereto. The first side display area D1 may be formed in a polygonal shape, a circular shape, an elliptical shape, or the like, when viewed in a plan view. The front display area D0 may have a rectangular shape in which corners are rounded, and the area other than the corners may extend to form the first side display area D1. For instance, the length of the first side display area D1 in the second direction DR2 may be shorter than the length of the front display area D0 in the second direction D2. The first side display area D1 may be bent along at least some of the dotted lines shown in FIGS. 1 and 3.

The first to fourth side display areas D1, D2, D3, and D4 may be spaced apart from each other at regular intervals. The first to fourth corner display areas DC1, DC2, DC3, and DC4 may be located between the first to fourth side display areas D1, D2, D3, and D4, which are spaced apart from each other, respectively. The first to fourth corner display areas DC1, DC2, DC3, and DC4 may be substantially the same as each other, except for their positions. Hereinafter, common characteristics of the first to fourth corner display areas DC1, DC2, DC3, and DC4 will be described with reference to the first corner display area DC1, and a duplicate description will be omitted.

The first corner display area DC1 may extend from the front display area D0 and may be formed round to have a predetermined curvature. The first corner display area DC1 may be located between the first side display area D1 and the second side display area D2. One end of the first corner display area DC1 may be in contact with the first side display area D1, and the other end of the first corner display area DC1 may be in contact with the second side display area D2. As will be described later, the display panel 300 may not be disposed in the first corner display area DC1. For instance, the first corner display area DC1 may not overlap the display panel 300.

The display device 1 according to some exemplary embodiments may display images not only on the front display area D0 and the first to fourth side display areas D1, D2, D3 and D4, but also on the first to fourth corner display areas DC1 and DC2, DC3, and DC4, thereby minimizing a dead space. Details thereof will be described later.

The display device 1 may include a display panel 300, and a cover window 100 disposed on one side of the display panel 300 in the third direction DR3.

Figure 13:
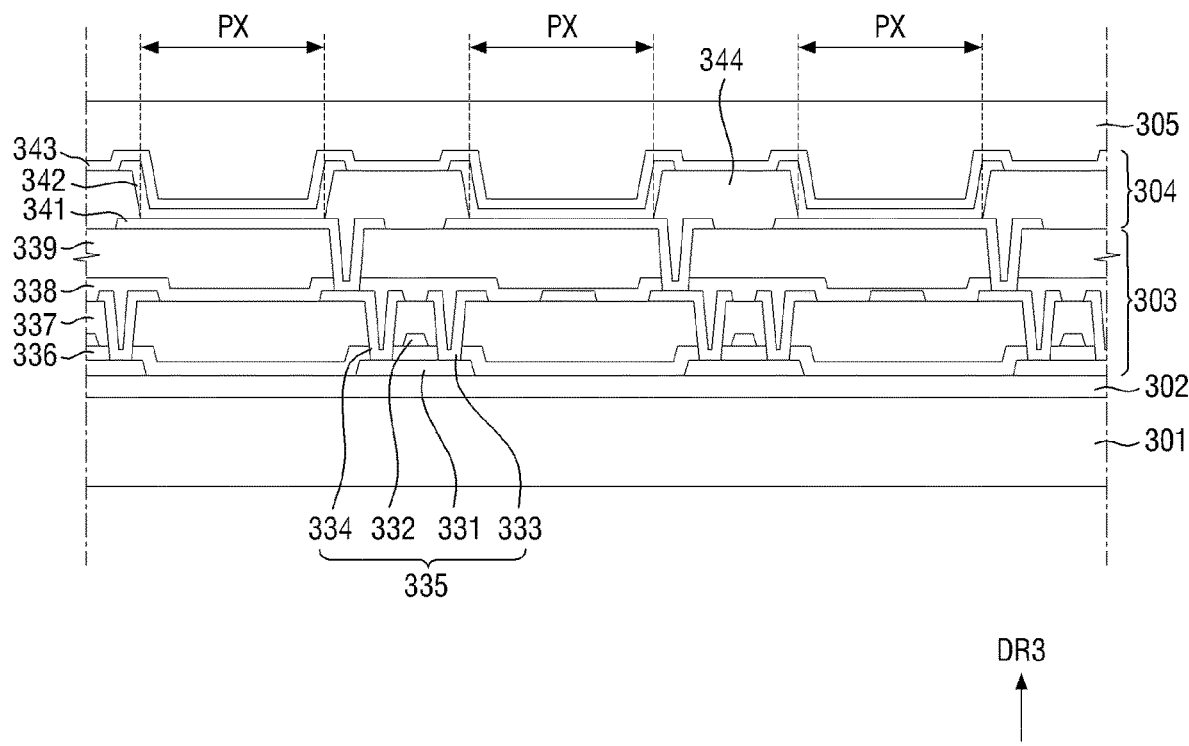
FIG. 13 is a cross-sectional view showing an example of a pixel according to some exemplary embodiments.

The display panel 300 may be a light emitting display panel including a light emitting element. For example, the display panel 300 may be an organic light emitting display panel using an organic light emitting diode as the light emitting element, an ultra-micro light emitting diode display panel using an ultra-micro light emitting diode (ultra-micro LED) as the light emitting element, a quantum dot light emitting display panel using a quantum dot and an organic light emitting diode, or an inorganic light emitting display panel using an inorganic semiconductor as the light emitting element. Hereinafter, a description will be made assuming that the display panel 300 is an organic light emitting display panel as shown in FIG. 13.

The display panel 300 may include a front area P0, first to fourth side areas P1, P2, P3, and P4, and first to fourth corner areas PC1, PC2, PC3, and PC4.

The front area P0 of the display panel 300 may correspond to the front display area D0 of the display device 1. For instance, the front area P0 of the display panel 300 may overlap the front display area D0 of the display device 1. The front area P0 may have a shape in which at least one corner is rounded. The front area P0 may have a polygonal shape with rounded corners. As shown in FIG. 2, the front area P0 may have a rectangular shape with rounded corners.

The first to fourth side areas P1, P2, P3, and P4 may include the first side area P1 extending to the other side of the front area P0 in (or opposite to) the first direction DR1, the second side area P2 extending to one side of the front area P0 in the second direction DR2, the third side area P3 extending to one side of the front area P0 in the first direction DR1, and the fourth side area P4 extending to the other side of the front area P0 in (or opposite to) the second direction DR2. The first to fourth side areas P1, P2, P3, and P4 may have substantially the same function or configuration as each other, except for their positions. Hereinafter, common characteristics of the first to fourth side display areas P1, P2, P3, and P4 will be described with reference to the first side area P1, and a duplicate description will be omitted.

The first side area P1 of the display panel 300 may correspond to the first side display area D1 of the display device 1. For instance, the first side area P1 of the display panel 300 may overlap the first side display area D1 of the display device 1.

The first side area P1 may extend from the front area P0 and may be bent at a predetermined angle. For example, the first side area P1 may be bent at an angle of 90° or more and 150° or less with respect to the front area P0. Although it is exemplified that the first side area P1 extending from the front area P0 has a rectangular shape, exemplary embodiments are not limited thereto. The first side area P1 may be formed in a polygonal shape, a circular shape, an elliptical shape, or the like, when viewed in a plan view. The front area P0 may have a rectangular shape in which corners are rounded, and the area other than the corners may extend to form the first side area P1. For instance, the length of the first side area P1 in the second direction DR2 may be shorter than the length of the front area P0 in the second direction D2. The first side area P1 may be bent along at least some of the dotted line shown in FIGS. 1 and 3. When the first side area P1 is bent, as shown in FIG. 2, the first to fourth side areas P1, P2, P3, and P4 may be spaced apart from each other at regular intervals. A plurality of pixels may be formed in the front region P0 and the first to fourth side regions P1, P2, P3, and P4 of the display panel 300. A plurality of pixels may be formed in the front area P0 and first to fourth side areas P1, P2, P3, and P4 of the display panel 300. The plurality of pixels may emit light on the basis of an input signal. For instance, the front area P0 and first to fourth side areas P1, P2, P3, and P4 of the display panel 300 may display images, respectively.

The first to fourth side areas P1, P2, P3, and P4 may be defined between the first to fourth corner areas PC1, PC2, PC3, ad PC4, respectively. The first to fourth corner areas PC1, PC2, PC3, ad PC4 may be substantially the same as each other, except for their positions. Hereinafter, common characteristics of the first to fourth corner areas PC1, PC2, PC3, ad PC4 will be described with reference to the first corner area PC1, and a duplicate description will be omitted.

The first corner area PC1 of the display panel 300 may correspond to the first corner area DC1 of the display device 1. For instance, the first corner area PC1 of the display panel 300 may overlap the first corner area DC1 of the display device 1.

The first corner area PC1 may be defined as a space (or opening) between the first side area P1 and the second side area P2. For example, the first corner area PC1 may be defined as an area in which the display panel 300 is not disposed among the areas adjacent to the corner portion (for instance, a portion where two sides meet) of the front area P0. For instance, the display panel 300 may not exist in the first corner area PC1 and the first corner display area DC1. Even when a light emitting element is omitted, the first corner area PC1 is provided with a light guide member for guiding an emitting light, thereby displaying an image on the first corner display area DC1. Thus, it is possible to minimize dead space of the display device 1. Details thereof will be described later.

Even when the display panel 300 is not disposed in the first to fourth corner display areas DC1 to DC4, the display device 1 according to some exemplary embodiments may display an image in the first to fourth corner display areas DC1 to DC4 to minimize dead space.

Hereinafter, a cross-sectional structure of the side display area of the display device 1 according to some exemplary embodiments will be described in more detail.

Figure 4:
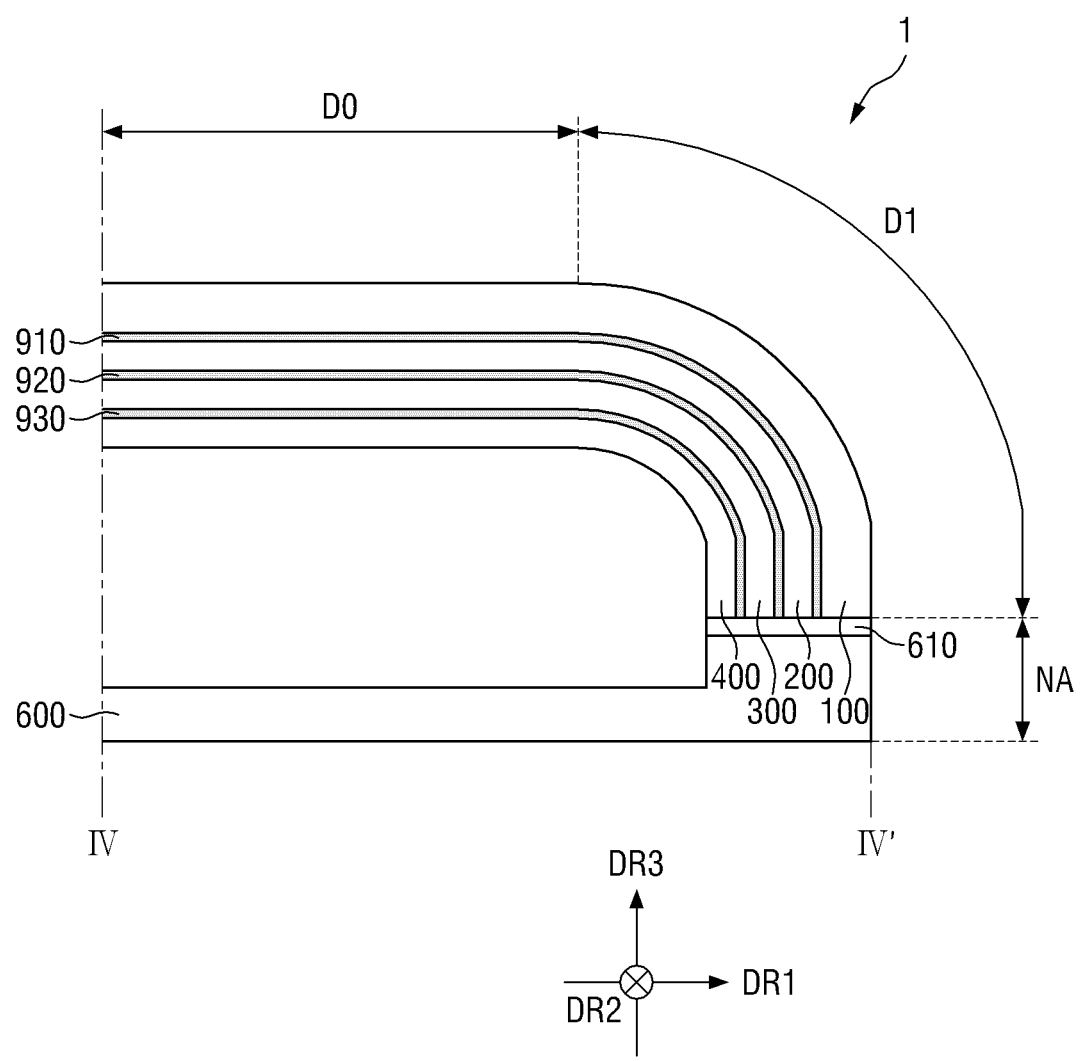
FIG. 4 is a cross-sectional view taken along sectional line IV-IV' of FIG. 1 according to some exemplary embodiments.

FIG. 4 is a cross-sectional view taken along sectional line IV-IV' of FIG. 1 according to some exemplary embodiments. Hereinafter, common characteristics of the first to fourth side display areas D1, D2, D3, and D4 will be described based on the first side display area D1 with reference to FIG. 4, and a duplicate description will be omitted.

The display device 1 according to some exemplary embodiments may include a cover window 100, a touch sensing unit 200, a display panel 300, a panel lower member 400, and a lower cover 600.

As will become more apparent later, the display panel 300 may include a substrate, a thin film transistor layer disposed on the substrate, a light emitting element layer, and a thin film encapsulation layer.

Since the display panel 300 is flexible, it may be formed of plastic; however, exemplary embodiments are not limited thereto. In this case, the substrate may include a flexible substrate and a support substrate. Since the support substrate serves to support a flexible substrate, the flexibility of the support substrate may be lower than the flexibility of the flexible substrate. Each of the flexible substrate and the support substrate may include, for instance, a polymer material having flexibility.

The thin film transistor layer is disposed on the substrate. The thin film transistor layer may include scan lines, data lines, and thin film transistors. Each of the thin film transistors includes a gate electrode, a semiconductor layer, a source electrode, and a drain electrode. When a scan driver is formed directly on the substrate, the scan driver may be formed together with the thin film transistor layer.

The light emitting element layer is disposed on the thin film transistor layer. The light emitting element layer may include an anode electrode, a light emitting layer, a cathode electrode, and a bank. The light emitting element layer may include an organic light emitting element layer including an organic material. For example, the light emitting element layer may include a hole injection layer, a hole transporting layer, an organic light emitting element layer, an electron transporting layer, and an electron injection layer. The hole injection layer and the electron injection layer may be omitted. When a voltage is applied to the anode electrode and the cathode electrode, holes and electrons move to the organic light emitting element layer through the hole transporting layer and the electron transporting layer, respectively, and are combined with each other in the organic light emitting element layer to emit light. The light emitting element layer may be a pixel array layer in which pixels are formed, and, thus, the area in which the light emitting element layer is formed may be defined as a display area in which an image is displayed. The peripheral area of the display area may be defined as a non-display area NA.

The thin film encapsulation layer is disposed on the light emitting element layer. The thin film encapsulation layer serves to prevent or at least reduce (hereinafter, referred to as prevent) oxygen and/or moisture from penetrating into the light emitting element layer. The thin film encapsulation layer may include at least one inorganic film and at least one organic film.

The touch sensing unit 200 may be disposed on the display panel 300. The touch sensing unit 200 may be attached to the upper surface of the display panel 300 through a second adhesive layer 920.

For example, the touch sensing unit 200 may be disposed between the cover window 100 and the display panel 300. The touch sensing unit 200 may be disposed on the upper surface and side surfaces of the display panel 300. Thus, a touch interaction (e.g., an actual touch event, an approaching touch, a hovering touch event, etc.) of a user can be detected from the upper surface and side surfaces of the display device 1.

The touch sensing unit 200 may be attached to the lower surface of the cover window 100 through a first adhesive member 910 as shown in FIG. 4. Although not shown, a polarizing film for preventing the deterioration of visibility due to the reflection of external light may be additionally disposed between the cover window 100 and the touch sensing unit 200. In this case, the touch sensing unit 200 may be attached to the lower surface of the polarizing film, and the polarizing film may be attached to the lower surface of the cover window 100 through the first adhesive member 910. Although FIG. 4 illustrates a case where the display device 1 includes a separate touch sensing unit 200, the touch sensing unit 200 may be omitted. In this case, the display panel 300 may include a touch layer, which may be formed through one or more continuous processes of forming the display panel 300 without the use of an adhesive layer to couple the touch layer to the display panel 300.

The cover window 100 may be disposed on the display panel 300. The cover window 100 may be disposed on the upper surface and side surfaces of the display panel 300 to cover the upper surface and side surfaces of the display panel 300. Accordingly, the cover window 100 may function to protect the upper surface and side surfaces of the display panel 300. When the touch sensing unit 200 is disposed between the cover window 100 and the display panel 300, the cover window 100 may be attached to the touch sensing unit 200 through the first adhesive member 910 as shown in FIG. 4. The first adhesive member 910 may be an optically clear adhesive (OCA) film or an optically clear resin (OCR) film; however, exemplary embodiments are not limited thereto.

The cover window 100 may be made of glass, sapphire, and/or plastic. The cover window 100 may be rigid and/or flexible.

The cover widow 100 may include a front display area D0, a light transmitting portion corresponding to the first side display area D1, and a light blocking portion corresponding to the non-display area NA. The light transmitting portion corresponding to the first side display area D1 may be formed to have a curved surface, and, in this case, the light transmitting portion may have a constant curvature or a variable curvature. The light blocking portion may include an opaque material, such as a black dye. Further, a pattern that can be displayed to the user may be formed on the upper surface of the light blocking portion when an image is not displayed. The panel lower member 400 may be disposed under the display panel 300. The panel lower member 400 may be attached to the lower surface of the display panel 300 through a third adhesive member 930. The third adhesive member 930 may be an optical clear adhesive (OCA) film, an optical clear resin (OCR) film, or a pressure sensitive adhesive (PSA) film; however, exemplary embodiments are not limited thereto.

The panel lower member 400 may include at least one of a light absorbing member for absorbing light incident from the outside, a buffer member for absorbing external impact, a light radiation member for efficiently radiating heat from the display panel 300, and a light blocking layer for blocking light incident from the outside.

The light absorbing member may be disposed under the display panel 300. The light absorbing member inhibits the transmission of light to prevent the structures disposed under the light absorbing member from being viewed from at the top of the display panel 300. The light absorbing member may include a light absorbing material, such as a black pigment or a dye.

The buffer member may be disposed below the light absorbing member. The buffer member absorbs an external impact to prevent the display panel 300 from being damaged. The buffer member may be formed of a single layer or a plurality of layers. For example, the buffer member may be made of a polymer resin, such as at least one of polyurethane, polycarbonate, polypropylene, and polyethylene, and/or may be made of an elastic material, such as at least one of a sponge obtained by foam-molding a rubber, a urethane-based material, and an acrylic material. The buffer member may be a cushion layer.

The heat radiation member may be disposed under the buffer member. The heat radiation member may include a first heat radiation layer including at least one of graphite and carbon nanotubes, and a second heat radiation layer blocking electromagnetic waves and formed of a metal thin film, such as at least one of copper, nickel, ferrite, and silver, having high thermal conductivity.

The lower cover 600 may be disposed under the panel lower member 400. The lower cover 600 may include plastic, metal, or both plastic and metal; however, exemplary embodiments are not limited thereto. The lower cover 600 may form a lower surface appearance of the display device 1.

A waterproof member 610 may be disposed on the rim of the lower cover 600. The waterproof member 610 may attach the side surfaces of the display panel 300 to the upper surface of the lower cover 600. As shown in FIG. 4, penetration of moisture and/or dust between the display panel 300 and the lower cover 600 may be prevented by the waterproof member 610. For instance, a waterproof and dustproof display device 1 can be provided.

Hereinafter, corner display areas of the display device 1 according to some exemplary embodiments will be described in more detail.

Figure 5:
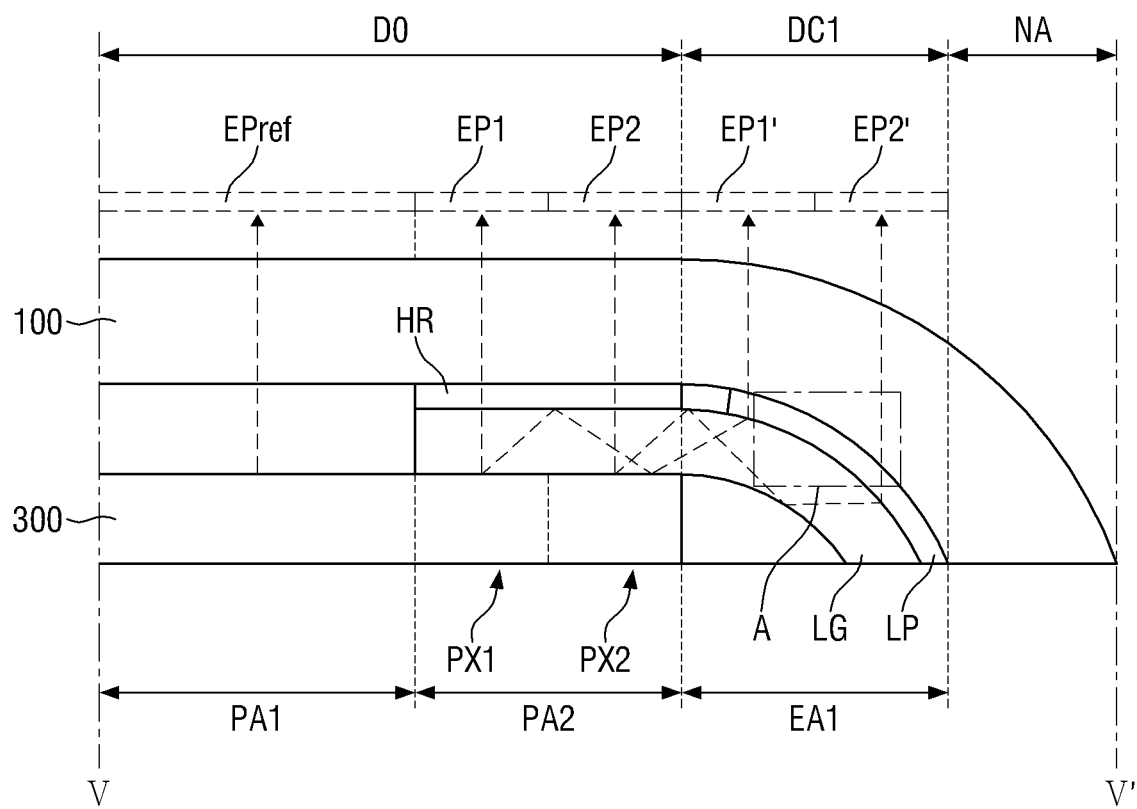
FIG. 5 is a cross-sectional view taken along sectional line V-V' of FIG. 2 according to some exemplary embodiments.
Figure 5:
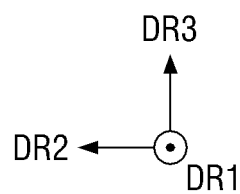
Figure 6:
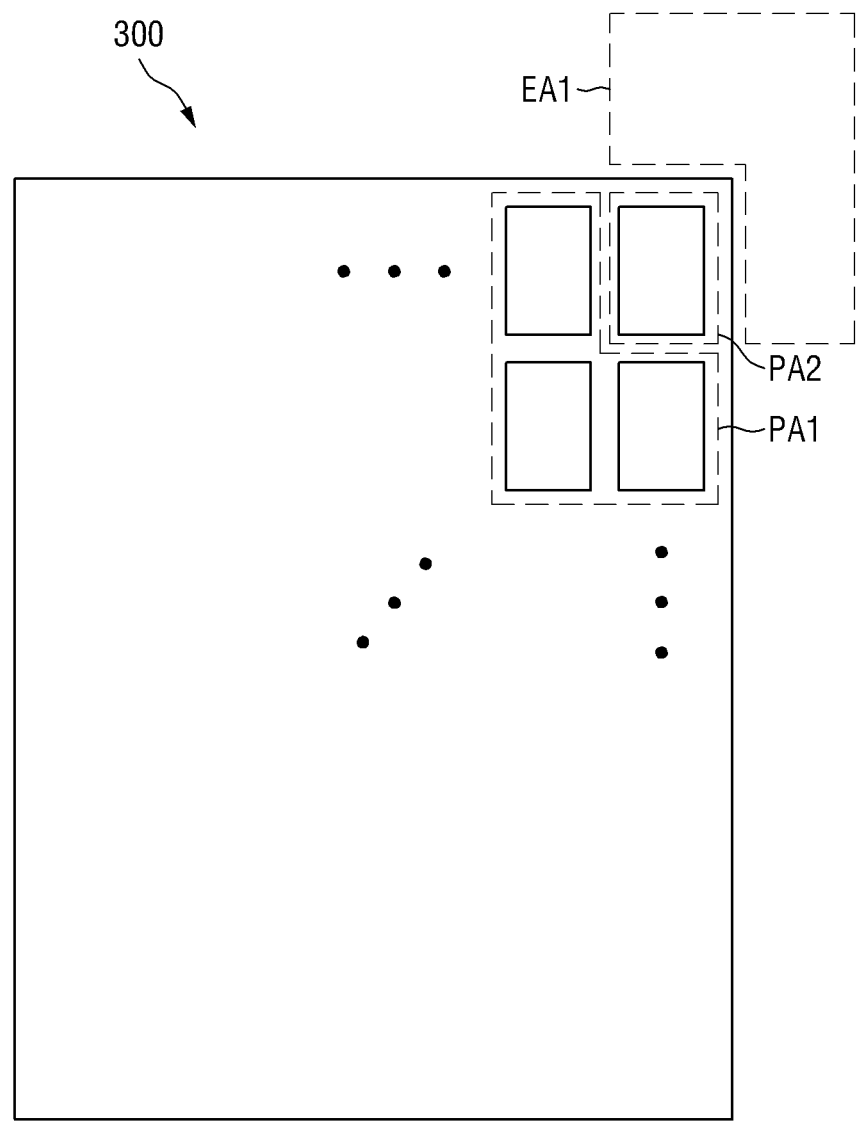
FIG. 6 is a plan view of a display panel for explaining light emitting areas of corner display areas according to some exemplary embodiments.

FIG. 5 is a cross-sectional view taken along sectional line V-V' of FIG. 2 according to some exemplary embodiments. FIG. 6 is a plan view of a display panel for explaining light emitting areas of corner display areas according to some exemplary embodiments. FIGS. 7 to 12 are enlarged cross-sectional views of display devices according to various exemplary embodiments. FIGS. 7 to 12 are based on the area A in FIG. 5.

The common characteristics of the first to fourth corner display areas DC1, DC2, DC3 and DC4 will be described based on the first corner display area DC1 with reference to FIGS. 5 to 12, and a duplicate description will be omitted. Meanwhile, for convenience of explanation, in FIG. 5, the touch sensing unit 200 and the adhesive member disposed between the cover window 100 and the display panel 300 are omitted.

The cover widow 100 may include a front display area D0, a light transmitting portion corresponding to the first corner display area DC1, and a light blocking portion corresponding to the non-display area NA adjacent to the first corner display area DC1. The area excluding the front display area D0 may be formed to have a curved surface, and, in this case, this area may have a constant curvature or a variable curvature.

The display panel 300 may be disposed under the cover window 100. The display panel 300 may overlap the front display area D0, but may not overlap the first corner display area DC1 and the non-display area NA.

The display panel 300 may include a first pixel area PA1 and a second pixel area PA2 adjacent to the first pixel area PA1. The luminance of the first pixel area PA1 and the luminance of the second pixel area PA2 may be different from each other. The second pixel area PA2 may include a first pixel PX1 and a second pixel PX2. In some exemplary embodiments, light emitted from the first pixel PX1 may be displayed on a first light emitting area EP1 of the front display area D0, and light emitted from the second pixel PX2 may be displayed on a second light emitting area EP2 of the front display area D0. Although it is illustrated in FIG. 5 that the second pixel area PA2 may include the first pixel PX1 and the second pixel PX2, exemplary embodiments are not limited thereto. For instance, the second pixel area PA2 may include three or more pixels PX, and may also include one pixel.

A light guide member LG may be disposed between the cover window 100 and the display panel 300. The light guide member LG may be formed directly on a thin film encapsulation layer 305 (see FIG. 13) of the display panel 300. The light guide member LG may overlap the front display area D0 and the first corner display area DC1, but may not overlap the non-display area NA. An area of the light guide member LG, overlapping the front display area D0, may be formed to be flat, and an area of the light guide member LG, overlapping the first corner display area DC1, may be formed to have a curved surface. In this case, the light guide member LG may have a constant curvature or a variable curvature. The curvature of the light guide member LG may be substantially equal to the curvature of the cover window 100. Further, the light guide member LG may overlap the second pixel area PA2 in the front display area D0, but may not overlap the first pixel area PA1.

The light guide member LG may be made of at least one of an organic material and an inorganic material. For example, the light guide member LG may be made of an organic material, such as poly(methyl methacrylate) (PMMA), polycarbonate (PC), or polyethylene terephthalate (PET), or an inorganic material, such as glass. The light guide member LG may be an optical fiber.

The light guide member LG may guide the light provided from the display panel 300 and display an image on the first corner display area DC1. For instance, the light provided to the light guide member LG may be totally reflected in the light guide member LG and guided to the first corner display area DC1. Further, the light emitted from the second pixel area PA2 of the display panel 300 may be displayed on a first corner light emitting area EA1. The first corner light emitting area EA1 may overlap the light guide member LG. The first corner light emitting area EA1 may be defined as an area where first and second light emitting areas EP1' and EP2' are formed. When the first corner light emitting area EA1 overlaps the first corner display area DC1, an image may be displayed on the first corner light emitting area EA1, and, thus, the dead space of the display device 1 may be minimized or at least reduced.

The semi-transmissive film HR may be disposed on the light guide member LG. For instance, the semi-transmissive film HR may be disposed between the cover window 100 and the light guide member LG. The semi-transmissive film HR may transmit a part of the light provided to the semi-transmissive film HR, and may not transmit another part of the light. The light not transmitted by the semi-transmissive film HR may be reflected by the semi-transmissive film HR, and the light reflected by the semi-transmissive film HR may be provided to the light guide member LG again. Meanwhile, the ratio of the light transmitted by the semi-transmissive film HR to the light reflected by the semi-transmissive film HR may be adjusted depending on the kind and thickness of the semi-transmissive film HR.

The semi-transmissive film HR may overlap the front display area D0, and may not overlap the first corner display area DC1 or the non-display area NA. The semi-transmissive film HR may overlap the light guide member LG in the thickness direction. The side surface of the semi-transmissive film HR may be disposed to be aligned with the side surface of the light guide member LG. Further, the semi-transmissive film HR may overlap the display panel 300 in the thickness direction. The semi-transmissive film HR may overlap the second pixel area PA2 of the display panel 300, and may not overlap the first pixel area PA1 of the display panel 300. The side surface of the semi-transmissive film HR may be disposed to be aligned with the side surface of the display panel 300. When the semi-transmissive film HR overlaps the second pixel area PA2, the light emitted from the second pixel area PA2 may pass through the semi-transmissive film HR and may be displayed on the front display area D0. For instance, the light emitted from the first pixel PX1 of the second pixel area PA2 may pass through the semi-transmissive film HR and may be displayed on the first light emitting area EP1 of the front display area D0. Further, the light emitted from the second pixel PX2 of the second pixel area PA2 may pass through the semi-transmissive film HR and may be displayed on the second light emitting area EP2 of the front display area D0.

Since the transmittance of the light transmitted by the semi-transmissive film HR may be decreased, the pixels PX of the second pixel area PA2 where the semi-transmissive film HR is disposed may be designed to emit light at high luminance in consideration of the decrease of the transmittance during driving, thereby uniformly maintaining the luminance of the front display area D0. For instance, the luminance of the first and second light emitting areas EP1 and EP2 may be substantially the same as the luminance of a reference light emitting area EPref.

Although FIG. 5 illustrates a case where the semi-transmissive film HR is disposed on the front surface of the second pixel area PA2, exemplary embodiments are not limited thereto. For instance, the semi-transmissive film HR may be disposed to be narrower than the width of the second pixel area PA2. Further, the semi-transmissive film HR may be disposed in only a part of the second pixel area PA2 in a slit shape. In this case, since the area where the semi-transmissive film HR is disposed on the display panel 300 is reduced, the transmittance of the light emitted from the second pixel area PA2 to the front display area D0 may increase. When the transmittance of the light emitted to the front display area D0 increases, the amount of the light provided to the light guide member LG decreases, and, thus, the transmittance of the light emitted to the first corner display area DC1 may decrease. In this case, the luminance of the first and second light emitting areas EP1 and EP2 may be higher than the luminance of the first and second light emitting areas EP1' and EP2'.

The semi-transmissive film HR may include a metal thin film. The metal thin film may be made of at least one metal of magnesium (Mg), silver (Ag), gold (Au), calcium (Ca), lithium (Li), chromium (Cr), and aluminum (Al), or an alloy including at least one of the aforementioned metal materials. However, the material of the semi-transmissive film HR is not limited thereto, and the semi-transmissive film HR may be made of, for instance, a polymer material.

A light emission pattern LP may be disposed on the light guide member LG. For instance, the light emission pattern LP may be disposed between the cover window 100 and the light guiding member LG, and may be in direct contact with the light guide member LG. The light emission pattern LP may overlap the first corner display area DC1, and may overlap the front display area D0 or the non-display area NA. The light emission pattern LP may be formed to have a curved surface. In this case, the light emission pattern LP may have a constant curvature or a variable curvature. The curvature of the light emission pattern LP may be substantially equal to the curvature of the light guiding member LG.

The light emission pattern LP may overlap the light guide member LG in the thickness direction. The light emission pattern LP may be spaced apart from the semi-transmissive film HR, and, thus, a predetermined gap may be defined between the light emission pattern LP and the semi-transmissive film HR. However, exemplary embodiments are not limited thereto, and the side surface of the light emission pattern LP and the side surface of the semi-transmissive film HR may be in contact with each other. The light emission pattern LP may not overlap the display panel 300 in the thickness direction.

Figure 7:
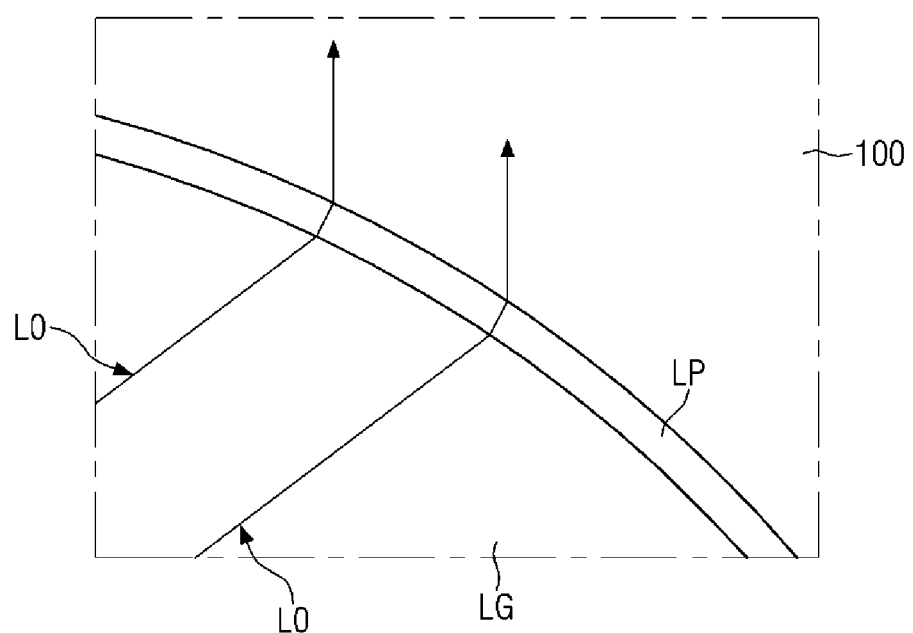
FIGS. 7, 8, 9, 10, 11, and 12 are enlarged cross-sectional views of display devices according to various exemplary embodiments.
Figure 8:
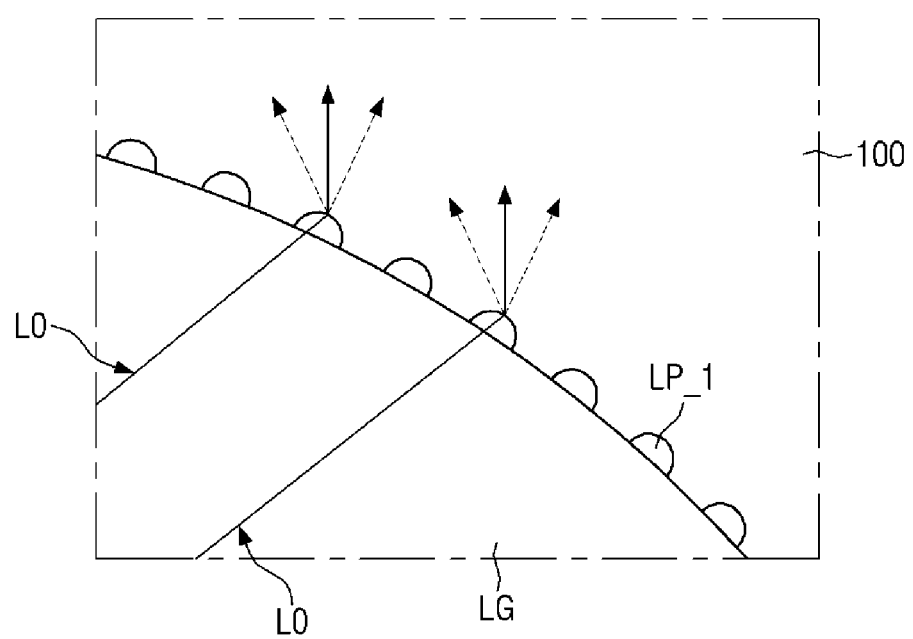
Figure 9:
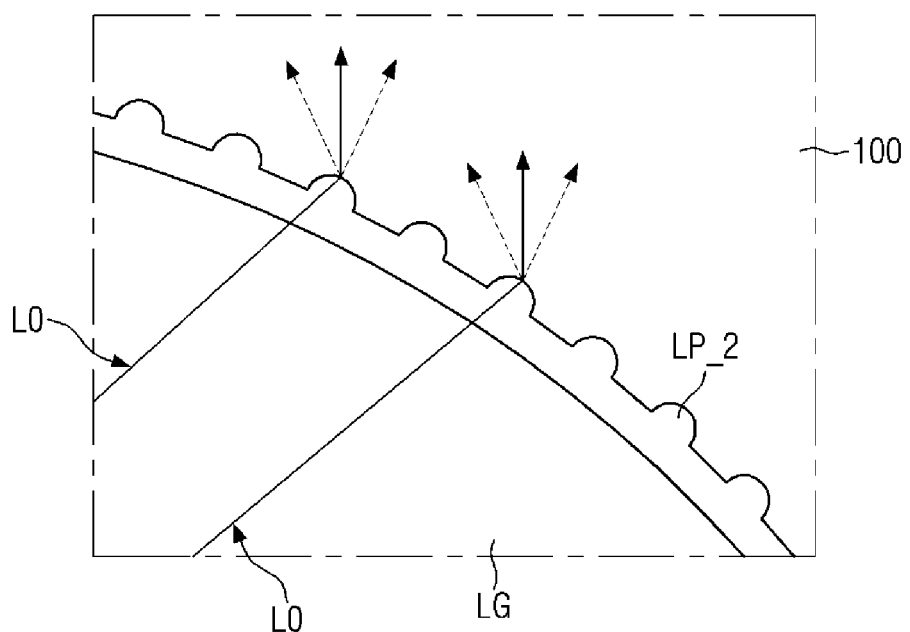
Figure 10:
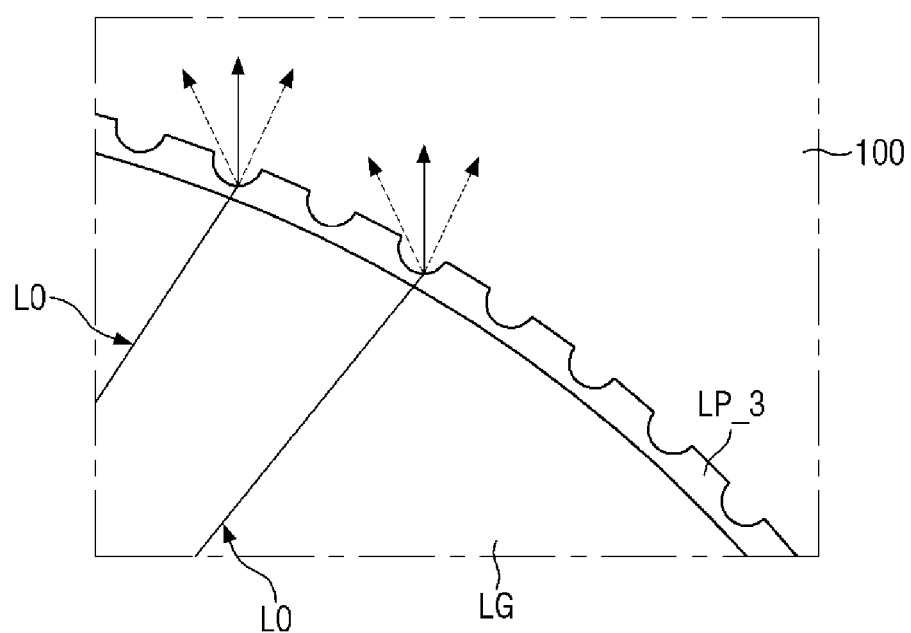
Figure 11:
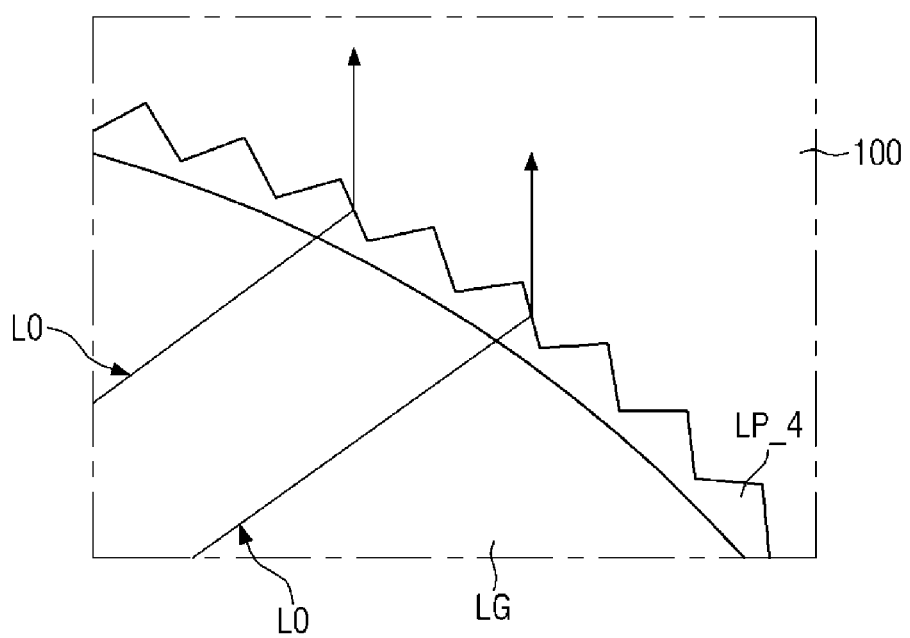
Figure 12:
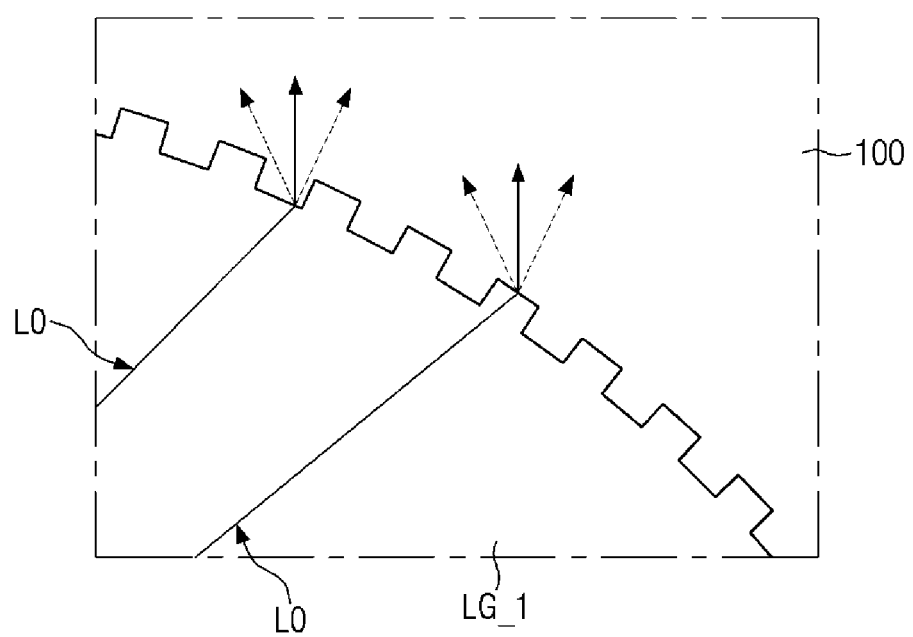

The light emission pattern LP may serve to display an image on the first corner display area DC1 by switching a light path by refracting or scattering the light guided by the light guide member LG. As shown in FIG. 7, the light L0 provided from the light guide member LG to the light emission pattern LP may be refracted at the interface of the light emission pattern LP and may be emitted in a direction perpendicular to the front display area D0. Further, as shown in FIG. 8, the light emission pattern LP_1 may be disposed on one surface of the light guide member LG in a dot shape. In this case, the light L0 provided from the light guide member LG to the light emission pattern LP_1 may be scattered at the interface of the light emission pattern LP_1 and may be emitted in a direction perpendicular to the front display area D0. Further, as shown in FIG. 9, the light emission pattern LP_2 may include a flat base and a plurality of protrusions formed on the base. The plurality of protrusions may share the base, and may be formed on one surface of the base in a dot shape. The protrusions and the base may be integrally formed. In this case, the light L0 provided from the light guide member LG to the light emission pattern LP_2 may be scattered at the interface of the light emission pattern LP_2 and may be emitted in a direction perpendicular to the front display area D0. Further, as shown in FIG. 10, the light emission pattern LP_3 may include a flat base and a plurality of depressions formed on one surface of the base. The depressions may be engraved patterns formed on one surface of the base. In this case, the light L0 provided from the light guide member LG to the light emission pattern LP_3 may be scattered at the interface of the light emission pattern LP_3 and may be emitted in a direction perpendicular to the front display area D0. Further, as shown in FIG. 11, the light emission pattern LP_4 may include a flat base and a plurality of prism patterns formed on one surface of the base. The base and the prism patterns may be integrally formed. In this case, the light L0 provided from the light guide member LG to the light emission pattern LP_4 may be refracted at the interface of the light emission pattern LP_4 and may be emitted in a direction perpendicular to the front display area D0. Further, as shown in FIG. 12, a plurality of engraved patterns may be formed on one surface of the light guide member LG_1. In this case, the light L0 passing through the light guide member LG_1 may be scattered at the interface of the engraved patterns of the light guide member LG_1 and may be emitted in a direction perpendicular to the front display area D0. Accordingly, the light emission pattern or the like for switching the light path may be omitted.

According to the aforementioned exemplary embodiments, even when the display panel 300 is not disposed in the first corner display area DC1, the light guide member LG and/or the light emission pattern LP are disposed to display an image, thereby minimizing (or at least reducing) the dead space of the display device 1.

Hereinafter, a cross-sectional structure of the display panel 300 will be described in more detail.

FIG. 13 is a cross-sectional view showing an example of a pixel according to some exemplary embodiments.

Referring to FIG. 13, the display panel 300 may include a support substrate 301, a flexible substrate 302, a thin film transistor layer 303, a light emitting element layer 304, and a thin film encapsulation layer 305.

The flexible substrate 302 is disposed on the support substrate 301. Each of the support substrate 301 and the flexible substrate 302 may include a polymer material having flexibility. In order to increase the flexibility of the display panel 300, the support substrate 301 may be omitted.

The thin film transistor layer 303 is formed on the flexible substrate 302. The thin film transistor layer 303 includes thin film transistors 335, a gate insulating film 336, an interlayer insulating film 337, a protective film 338, and a planarization film 339.

A buffer film may be formed on the flexible substrate 302. The buffer film may be formed on the flexible substrate 302 in order to protect the thin film transistors 335 and light emitting elements from moisture permeating through the flexible substrate 302 and the support substrate 301, which may be vulnerable to moisture permeation. The buffer film may be composed of a plurality of laminated inorganic films.

The thin film transistor 335 may be formed on the buffer film. The thin film transistor 335 includes an active layer 331, a gate electrode 332, a source electrode 333, and a drain electrode 334.

The active layer 331 may be formed on the buffer film. The active layer 331 may be formed of a silicon-based semiconductor material or an oxide-based semiconductor material; however, exemplary embodiments are not limited thereto. A light blocking layer for blocking external light incident on the active layer 331 may be formed between the buffer film and the active layer 331.

The gate insulating film 336 may be formed on the active layer 331. The gate insulating film 336 may be formed of an inorganic film, for example, a silicon oxide film (SiOx), a silicon nitride film (SiNx), or a multi-layered film thereof, but exemplary embodiments are not limited thereto.

The gate electrode 332 and the gate line may be formed on the gate insulating film 336. The gate electrode 332 and the gate line may be formed of a single layer or a multi-layer structure including, for instance, at least one of molybdenum (Mo), aluminum (Al), chromium (Cr), gold (Au), titanium (Ti), nickel (Ni), neodymium (Nd), and copper (Cu), or an alloy including at least one of the aforementioned materials.

The interlayer insulating film 337 may be formed on the gate electrode 332 and the gate line. The interlayer insulating film 337 may be formed of an inorganic film, for example, a silicon oxide film (SiOx), a silicon nitride film (SiNx), or a multi-layered film thereof, but exemplary embodiments are not limited thereto.

The source electrode 333, the drain electrode 334, and the data line may be formed on the interlayer insulating film 337. Each of the source electrode 333 and the drain electrode 334 may be connected to the active layer 331 through a contact hole penetrating the gate insulating film 336 and the interlayer insulating film 337. The source electrode 333, the drain electrode 334, and the data line may be formed of a single layer or a multi-layer including any one of molybdenum (Mo), aluminum (Al), chromium (Cr), gold (Au), titanium (Ti), nickel (Ni), neodymium (Nd), and copper (Cu), or an alloy thereof.

The protective film 338 for insulating the thin film transistor 335 may be formed on the source electrode 333, the drain electrode 334, and the data line. The protective film 338 may be formed of an inorganic film, for example, a silicon oxide film (SiOx), a silicon nitride film (SiNx), or a multi-layered film thereof.

The planarization film 339 may planarize a step caused by the thin film transistor 335 and may be formed on the protective film 333. The planarization film 339 may be an organic film formed of, for instance, at least one of an acrylic resin, an epoxy resin, a phenolic resin, a polyamide resin, and a polyimide resin.

The light emitting element layer 304 is formed on the thin film transistor layer 303. The light emitting element layer 304 includes light emitting elements and a pixel defining film 344.

The light emitting elements and the pixel defining film 344 are formed on the planarization film 339. The light emitting element may be an organic light emitting element. In this case, the light emitting element may include an anode electrode 341, light emitting layer 342, and a cathode electrode 343.

The anode electrode 341 may be formed on the planarization film 339. The anode electrode 341 may be connected to the drain electrode 334 of the thin film transistor 335 through a contact hole penetrating the protective film 338 and the planarization film 339.

The pixel defining film 344 for defining pixels PX may be formed on the planarization film 339 to cover the edge of the anode electrode 341. For instance, the pixel defining film 344 serves to define the pixels PX. Each of the pixels PX indicates an area where the anode electrode 341, the light emitting layer 342, and the cathode electrode 343 are sequentially laminated, and, thus, holes from the anode electrode 341 are combined with electrons from the cathode electrode 343 to emit light.

The light emitting layer 342 are formed on the anode electrode 341 and the pixel defining film 344. The light emitting layer 342 may be an organic light emitting layer. The light emitting layer 342 may emit one of red light, green light, or blue light, but exemplary embodiments are not limited thereto. The light emitting layer 342 may include a hole transporting layer, a light emitting layer, and an electron transporting layer. Further, the light emitting layer 342 may be formed in a tandem structure of two stacks or more, and, in this case, a charge generating layer may be formed between the stacks.

The cathode electrode 343 is formed on the light emitting layer 342. The cathode electrode 343 may be formed to cover the light emitting layer 342. The cathode electrode 343 may be a common layer formed commonly in the pixels PX.

When the light emitting element layer 304 is formed by a top emission manner in which light is emitted in an upward direction, the anode electrode 341 may be formed of a high-reflectance metal material, such as a laminate structure of aluminum (Al) and titanium (Ti), e.g., Ti/Al/Ti, a laminate structure of aluminum (Al) and indium tin oxide (ITO), e.g., ITO/Al/ITO, an APC alloy, or a laminate structure of an APC alloy and ITO, e.g., ITO/APC/ITO. The APC alloy may be an alloy of silver (Ag), palladium (Pd), and copper alloy (Cu). The cathode electrode 343 may be formed of a transparent conductive material (TCO), such as ITO or indium zinc oxide (IZO), which is light-transmissive, or a semi-transmissive conductive material, such as magnesium (Mg), silver (Ag), or an alloy of magnesium (Mg) and silver (Ag). When the cathode electrode 343 is formed of a semi-transmissive metal material, light emission efficiency may be increased by microcavities.

When the light emitting element layer 304 is formed by a bottom emission manner in which light is emitted in a downward direction, the anode electrode 341 may be formed of a transparent conductive material (TCO), such as ITO or IZO, which is light-transmissive, or a semi-transmissive conductive material, such as magnesium (Mg), silver (Ag), or an alloy of magnesium (Mg) and silver (Ag). The cathode electrode 343 may be formed of a high-reflectance metal material, such as a laminate structure of aluminum (Al) and titanium (Ti), e.g., Ti/Al/Ti, a laminate structure of aluminum (Al) and ITO, e.g., ITO/Al/ITO, an APC alloy, or a laminate structure of an APC alloy and ITO, e.g., ITO/APC/ITO. When the anode electrode 341 is formed of a semi-transmissive metal material, light emission efficiency may be increased by microcavities.

The thin film encapsulation layer 305 is formed on the light emitting element layer 304. The thin film encapsulation layer 305 serves to prevent oxygen and/or moisture from permeating the light emitting layer 342 and the cathode electrode 343. For this purpose, the thin film encapsulation layer 305 may include at least one inorganic film. The inorganic film may be formed of at least one of silicon nitride, aluminum nitride, zirconium nitride, titanium nitride, hafnium nitride, tantalum nitride, silicon oxide, aluminum oxide, and titanium oxide. The thin film encapsulation layer 305 may further include at least one organic film. The organic film may be formed to have a sufficient thickness to prevent foreign matter, e.g., particles, from penetrating the thin film encapsulation layer 305 and entering the light emitting layer 342 and the cathode electrode 343. The organic film may include at least one of epoxy, acrylate, and urethane acrylate.

Hereinafter, additional exemplary embodiments will be described.

Figure 14:
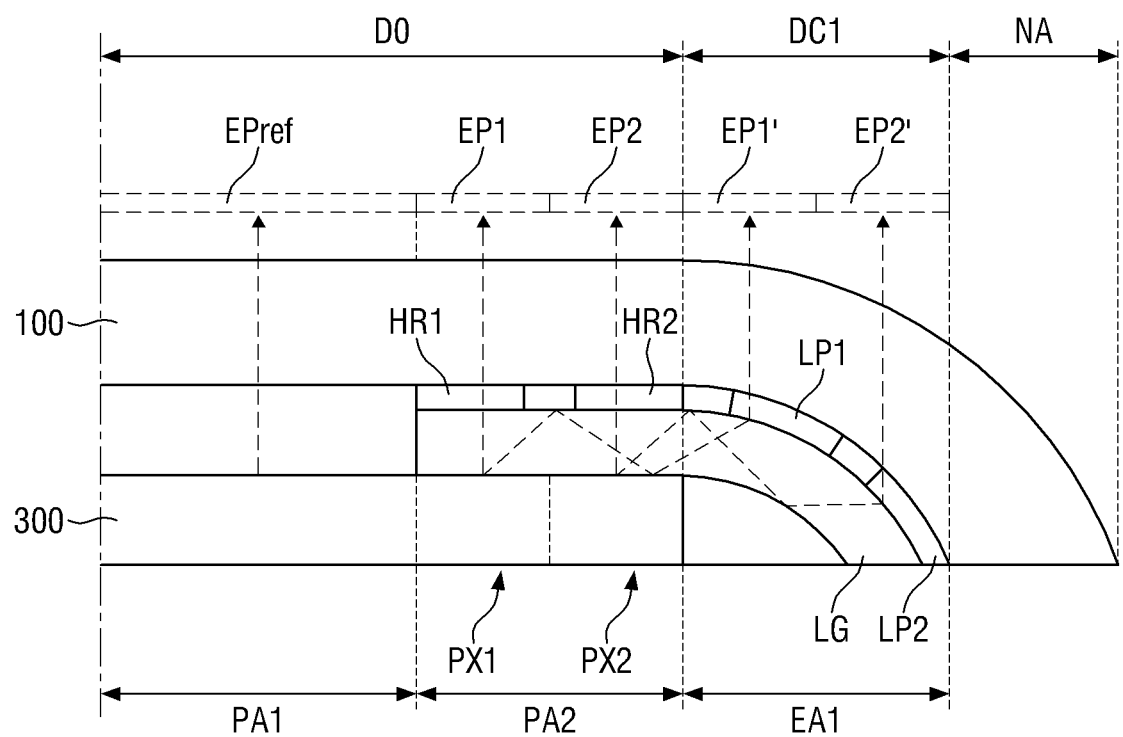
FIG. 14 is a cross-sectional view of a display device according to some exemplary embodiments.
Figure 14:
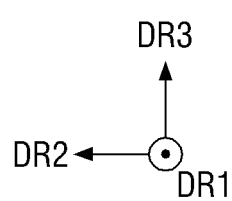

FIG. 14 is a cross-sectional view of a display device according to some exemplary embodiments.

Referring to FIG. 14, a display device according to some exemplary embodiments is different from the display device 1 of FIGS. 1-13 in that the semi-transmissive film HR includes a first semi-transmissive film HR1 and a second semi-transmissive film HR2, and the light emission pattern LP includes a first light emission pattern LP1 and a second light emission pattern LP2. Since the display device of FIG. 14 is substantially the same as or similar to the display device 1, except for these points, a duplicate description will be omitted.

According to some exemplary embodiments, the first semi-transmissive film HR1 and the second semi-transmissive film HR2 may be disposed on the second pixel area PA2. The first semi-transmissive film HR1 and the second semi-transmissive film HR2 may be spaced apart from each other in a plan view, and, thus, a predetermined gap may be defined between the first semi-transmissive film HR1 and the second semi-transmissive film HR2. The first semi-transmissive film HR1 may overlap the first pixel PX1 in the thickness direction, and the second semi-transmissive film HR2 may overlap the second pixel PX2 in the thickness direction. The light emitted from the first pixel PX1 may pass through the first semi-transmissive film HR1 and may be displayed on the first light emitting area EP1 of the front display area D0. The light emitted from the second pixel PX2 may pass through the second semi-transmissive film HR2 and may be displayed on the second light emitting area EP2 of the front display area D0. The width of the first semi-transmissive film HR1 may be substantially equal to the width of the second semi-transmissive film HR2. The width of the first semi-transmissive film HR1 may be substantially equal to or greater than the width of the first pixel PX1. The width of the second semi-transmissive film HR2 may be substantially equal to or greater than the width of the second pixel PX2. The side surface of the first semi-transmissive film HR1 may be disposed to be aligned with the side surface of the light guide member LG. The side surface of the second semi-transmissive film HR2 may be disposed to be aligned with the side surface of the display panel 300.

The first light emission pattern LP1 and the second light emission pattern LP2 may be disposed between the cover window 100 and the light guide member LG.

The first light emission pattern LP1 and the second light emission pattern LP2 may be spaced apart from each other in a plan view, and, thus, a predetermined gap may be defined between the first light emission pattern LP1 and the second light emission pattern LP2. Further, the first light emission pattern LP1 and the second semi-transmissive film HR2 may be spaced apart from each other in a plan view, and, thus, a predetermined gap may also be defined between the first light emission pattern LP1 and the second semi-transmissive film HR2.

The light emitted from the first pixel PX1 may be guided to the first light emission pattern LP1 by the light guide member LG, may pass through the first light emission pattern LP1, and may be displayed on the first light emitting area EP1' of the first corner display area DC1. Further, the light emitted from the second pixel PX2 may be guided to the second light emission pattern LP2 by the light guide member LG, may pass through the second light emission pattern LP2, and may be displayed on the second light emitting area EP2' of the first corner display area DC1. For instance, the first light emitting area EP1' and the second light emitting area EP2' may be displayed in the first corner display area DC1. For instance, since images may be displayed not only in the front and side areas, but also in corner areas, the dead space of the display device may be minimized or at least reduced.

Although FIG. 14 illustrates a case where the light emitted from the first pixel PX1 is guided to the first light emission pattern LP1 and is emitted to the first light emission area EP1' and the light emitted from the second pixel PX2 is guided to the second light emission pattern LP2 and is emitted to the second light emission area EP2', exemplary embodiments are not limited thereto. For instance, the light emitted from the first pixel PX1 may be guided to the second light emission pattern LP2, and the light emitted from the second pixel PX2 may be guided to the first light emission pattern LP1. In this case, the layout of light emitting areas in the first corner light emitting area EA1 of the first corner display area DC1 may be reversed. For instance, the second light emitting area EP2' may be disposed in the first corner light emitting area EA1 adjacent to the front display area D0, and the first light emitting area EP1' may be disposed in the first corner light emitting area EA1 adjacent to the non-display area NA.

Hereinafter, additional exemplary embodiments will be described.

Figure 15:
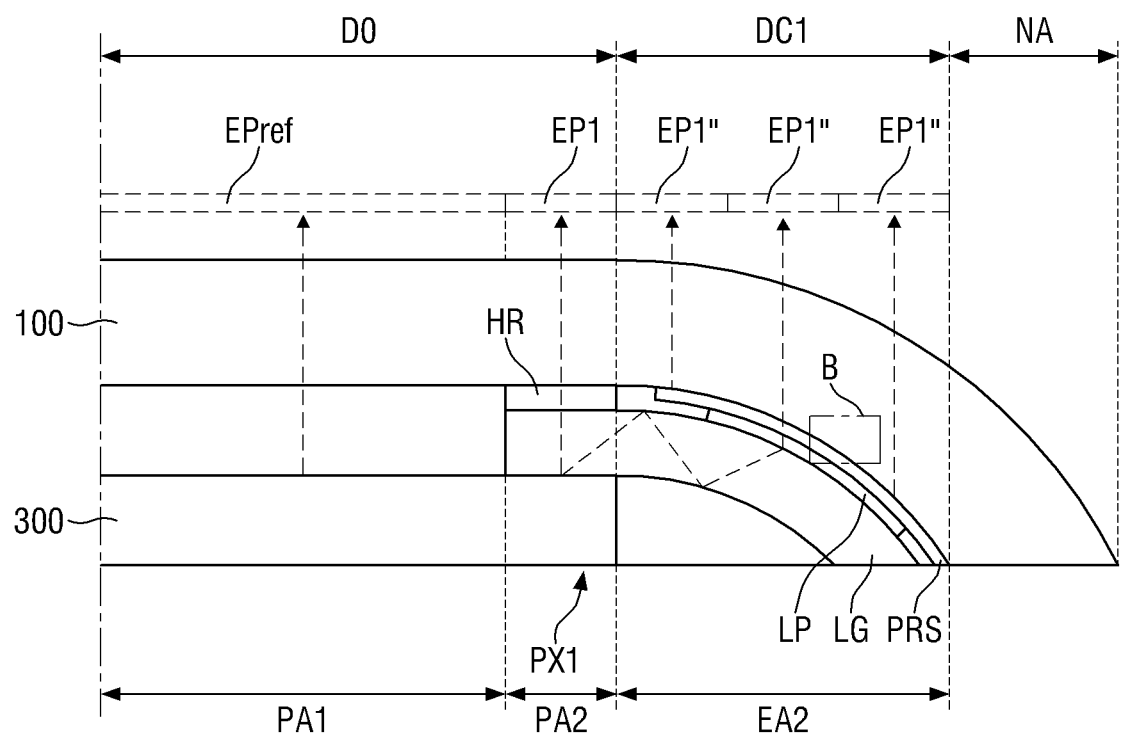
FIG. 15 is a cross-sectional view of a display device according to some exemplary embodiments.
Figure 15:
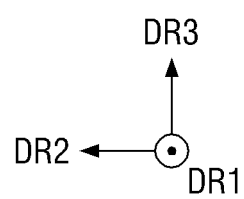
Figure 16:
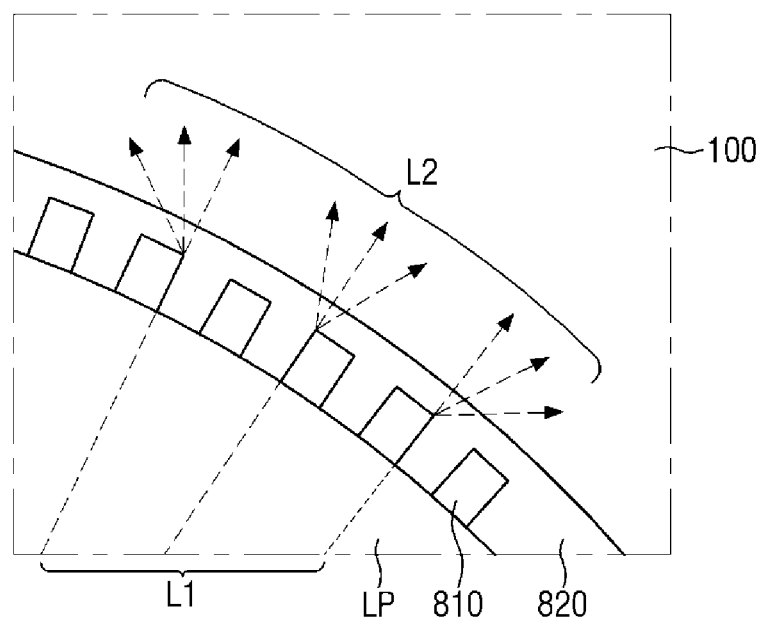
FIG. 16 is an enlarged view of the area B of FIG. 15 according to some exemplary embodiments.

FIG. 15 is a cross-sectional view of a display device according to some exemplary embodiments. FIG. 16 is an enlarged view of the area B of FIG. 15 according to some exemplary embodiments.

Referring to FIGS. 15 and 16, the display device according to some exemplary embodiments is different from the display device 1 of FIGS. 1-13 in that a diffraction pattern layer PRS is further disposed between the cover window 100 and the light guide member LG. Since the display device of FIGS. 15 and 16 is substantially the same as or similar to the display device 1 of FIGS. 1-13 except for this point, a duplicate description will be omitted.

According to some exemplary embodiments, the diffraction pattern layer PRS may be disposed between the cover window 100 and the light guide member LG, and may be disposed between the cover window 100 and the light emission pattern LP when the light emission pattern is further disposed (or included). Further, the diffraction pattern layer PRS may be disposed on the second corner light emitting area EA2 in a plan view. The diffraction pattern layer PRS may not overlap the display panel 300 in the thickness direction. Further, the diffraction pattern layer PRS may be spaced apart from the semi-transmissive film HR in a plan view, and, thus, a predetermined gap may be defined between the diffraction pattern layer PRS and the semi-transmissive film HR.

The diffraction pattern layer PRS may diffract the light L1 guided by the light guide member LG to form diffracted light L2. The diffracted light L2 may include zeroth-order diffracted light and first-order diffracted light. Here, the zeroth-order diffracted light refers to light which has the same optical path before and after being diffracted by the diffraction pattern layer PRS. Further, the first-order diffracted light refers to light, the optical path of which is changed and which has a predetermined diffraction angle with respect to the zeroth-order diffracted light.

Since the diffraction pattern layer PRS diffracts the light L1 guided by the light guide member LG, the second corner light emitting area EA2 may include a plurality of replicated light emitting areas EP1". The plurality of replicated light emitting areas EP1" may be light emitting areas replicated from the first light emitting area EP1 formed by the first pixel PX1.

The diffraction pattern layer PRS may include a plurality of diffraction patterns 810 and a first protective layer 820. The plurality of diffraction patterns 810 may be disposed directly on the light emission pattern LP. For instance, a separate adhesive member may not be disposed between the plurality of diffraction patterns 810 and the light emission pattern LP.

The plurality of diffraction patterns 810 may be patterns having periodicity. The plurality of diffraction patterns 810 may diffract the light emitted from the light guide member LG to enlarge the light emitting area of the light. For instance, as the second corner light emitting area EA2 of the first corner display area DC1 may be enlarged, and the dead space of the display device may be further minimized or at least further reduced.

The first protective layer 820 may be disposed on the plurality of diffraction patterns 810. The first protective layer 820 may be formed to cover the plurality of diffraction patterns 810. The first protective layer 820 may be an organic film including at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin. Alternatively (or additionally), the first protective layer 820 may be an inorganic film including at least one of aluminum oxide, titanium oxide, silicon oxide, silicon oxynitride, zirconium oxide, and hafnium oxide. The first protective layer 820 may be replaced by an air layer.

The diffraction pattern layer PRS may be formed to have a curved surface. In this case, the diffraction pattern layer PRS may have a constant curvature or a variable curvature, and the curvature of the diffraction pattern layer PRS may be substantially equal to the curvature of the light guide member LG.

Although FIGS. 15 and 16 illustrate a case where the light emission pattern LP is disposed on the light guide member LG and the diffraction pattern layer PRS is disposed on the light emission pattern LP, exemplary embodiments are not limited thereto. For instance, the light emission pattern LP may be omitted, and, in this case, the diffraction pattern layer PRS may be disposed directly on the light guide member LG.

According to various exemplary embodiments, a light guide member or the like is disposed in corner display areas of a display device, thereby displaying images in the corner display areas, as well as a front display area and side display areas of the display device. For instance, the display device can minimize or at least reduce a dead space by displaying images in the corner areas, as well as the front area and the side areas.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
a front display area;
a first side display area extending from a first side of the front display area;
a second side display area extending from a second side of the front display area;
a corner display area disposed between the first side display area and the second side display area;
a display panel overlapping the front display area and not overlapping the corner display area; and
a light guide member disposed in the corner display area.

2. The display device of claim 1, wherein the light guide member is configured to guide light emitted from the display panel and transmit the light to the corner display area.

3. The display device of claim 2, wherein the light guide member at least partially overlaps the display panel.

4. The display device of claim 3, wherein:
the display panel comprise a first pixel area and a second pixel area;
the second pixel area comprises a first pixel and a second pixel;
the corner display area comprises a first light emitting area and a second light emitting area; and
the light guide member is configured to:
guide light emitted from the first pixel and transmit the light from the first pixel to the first light emitting area; and
guide light emitted from the second pixel and transmit the light from the second pixel to the second light emitting area.

5. The display device of claim 4, wherein, in a thickness direction, the light guide member overlaps the second pixel area in the front display area.

6. The display device of claim 5, wherein:
the display panel comprises a substrate, a light emitting layer disposed on the substrate, and an encapsulation layer disposed on the light emitting layer; and
the light guide member directly contacts the encapsulation layer.

7. The display device of claim 5, wherein:
the display panel comprises a first side area, a second side area spaced apart from the first side area, and a corner area defined in a space between the first side area and the second side area; and
the corner area overlaps the corner display area.

8. The display device of claim 5, further comprising:
a semi-transmissive film disposed on the light guide member and overlapping the display panel.

9. The display device of claim 8, further comprising:
a light emission pattern disposed in the corner display area and overlapping the light guide member in a thickness direction.

10. The display device of claim 9, wherein the semi-transmissive film does not overlap the light emission pattern in the thickness direction.

11. The display device of claim 10, wherein a curvature of the light guide member is substantially equal to a curvature of the light emission pattern.

12. A display device, comprising:
a first display area;
a second display area adjacent to the first display area;
a display panel disposed in the second display area and not overlapping the first display area;
a semi-transmissive film disposed on the light guide member and overlapping the second pixel area; and
a light guide member disposed in the first display area, wherein:
the display panel comprises a first pixel area and a second pixel area,
the light guide member overlaps the second pixel area, and
the light guide member and the semi-transmissive film do not overlap the first pixel area in a thickness direction.

13. The display device of claim 12, wherein the light guide member is configured to guide light emitted from the second pixel area and transmit the light to the first display area.

14. The display device of claim 12, further comprising:
a diffraction pattern layer disposed on the light guide member in the first display area.

15. The display device of claim 14, wherein:
the diffraction pattern layer is configured to diffract light emitted from the display panel to generate a replicated light emitting area; and the display device is configured to display the replicated light emitting area on the first display area.

16. A display device comprising:
a first display area;
a second display area adjacent to the first display area;
a display panel disposed in the second display area and not overlapping the first display area;
a light guide member disposed in the first display area; and
a diffraction pattern layer disposed on the light guide member in the first display area,
wherein the diffraction pattern layer comprises:
   a plurality of diffraction patterns; and
   a protective layer disposed on the plurality of diffraction patterns.

17. A display device comprising:
a first display area;
a second display area adjacent to the first display area;
a display panel disposed in the second display area and not overlapping the first display area;
a light guide member disposed in the first display area;
a diffraction pattern layer disposed on the light guide member in the first display area; and
a light emission pattern disposed between the light guide member and the diffraction pattern layer.

* * * * *